324-71 SEARCH ROOM
PULSE ENERGY QUANTIZER
Filed Oct. 17, 1966
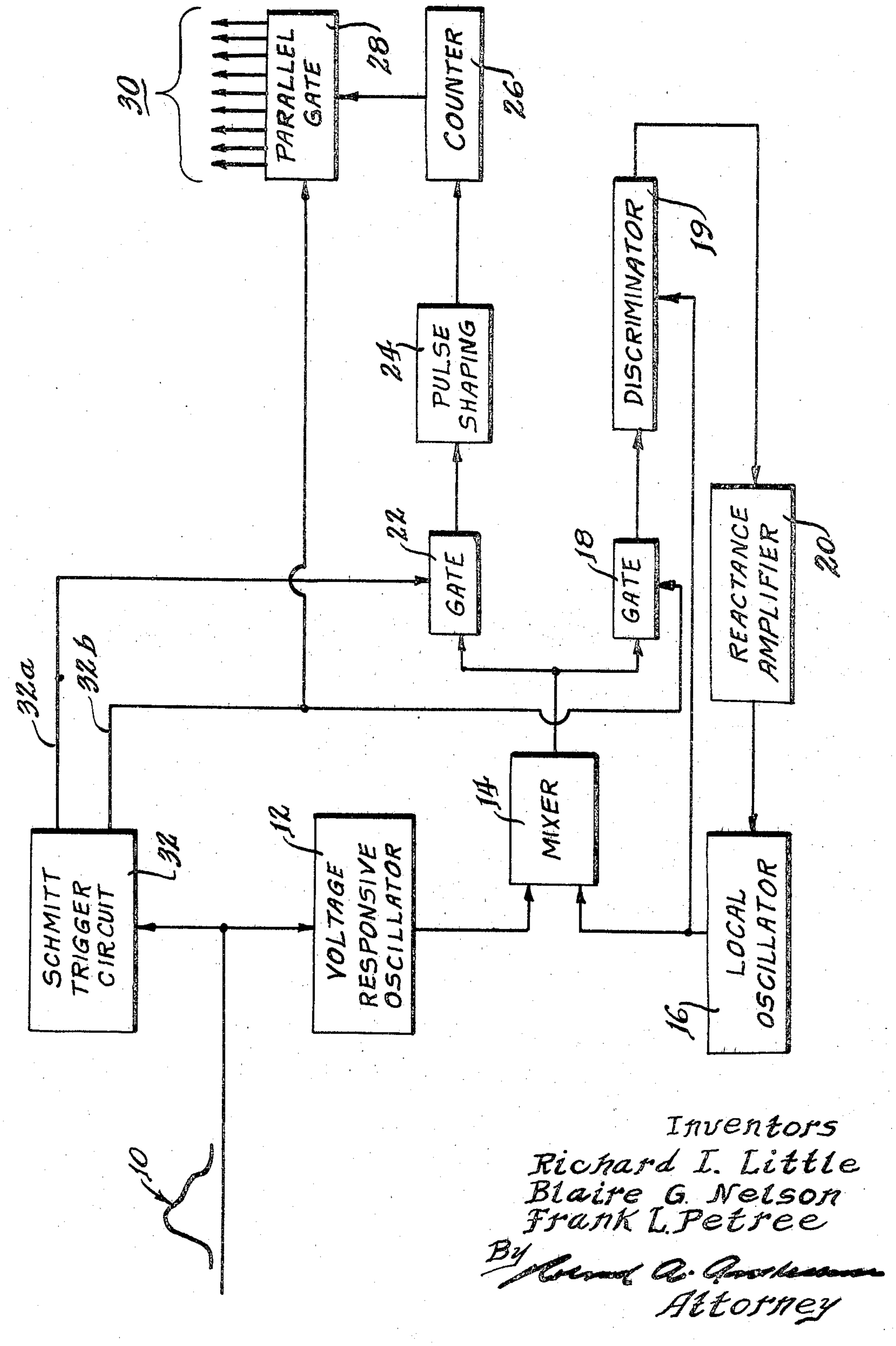
Inventors
Richard I. Little
Blaire G. Nelson
Frank L. Petree
By [signature]
Attorney United States Patent Office 3,491,294
Patented Jan. 20, 1970

3,491,294
PULSE ENERGY QUANTIZER

Richard I. Little, Barrington, Ill., Blaire Geve Nelson, Idaho Falls, Idaho, and Frank L. Petree, Hamden, Conn., assignors to the United States of America as represented by the United States Atomic Energy Commission Filed Oct. 17, 1966, Ser. No. 588,268
Int. Cl. G01r *23/16*
U.S. Cl. 324—77 2 Claims

ABSTRACT OF THE DISCLOSURE

The device disclosed generates a digital representation of the time integral of an arbitrary input pulse and includes a first oscillator producing an output signal having a frequency which increases from a base frequency by an amount proportional to the instantaneous amplitude of said input pulse, a second oscillator producing an output signal having a frequency equal to the base frequency of the first oscillator, a mixer producing an output signal having a frequency proportional to the difference in frequency of the two oscillator output signals, a threshold circuit detecting the presence and absence of said input pulse, a feedback circuit adjusting during the absence of said input pulse the base frequency of the second oscillator such that the mixer output frequency is a minimum, and a digital counter accumulating during the presence of said input pulse the number of frequency cycles in the mixer output signal.

The invention described herein was made in the course of, or under, a contract with the United States Atomic Energy Commission.

The present invention relates to apparatus for quantizing the energy content of an arbitrary input pulse signal. More particularly the present invention relates to apparatus for generating a binary representation of the time integral of an arbitrary input pulse signal.

The main object of the present invention is to generate a binary word representative of the total energy content within the envelope of an arbitrary input pulse signal.

It is a further object of the present invention to provide apparatus for quantizing the energy contained in an input pulse signal and for generating a signal indicative of the fact that the quantized representation of the input pulse is complete so that it may be read out of the apparatus or otherwise made use of.

It is an even further object of the present invention to provide apparatus for quantizing the energy content of an arbitrary input pulse signal wherein the apparatus dead time between input pulses is relatively short.

Briefly, the above objects are accomplished as follows. A voltage-responsive osecillator, whose frequency of oscillation increases from a base frequency by an amount proportional to the instantaneous amplitude of its input voltage, receives the input pulse signal to be quantized. A second oscillator is adapted to oscillate at the base frequency of the first oscillator by means of an error signal fed back to adjust the frequency of the second oscillator. The outputs of the two oscillators are fed into a mixer circuit. The output of the mixer circuit is a continuous signal having a frequency equal to the difference between the frequencies of the two oscillators. Each cycle of the difference frequency triggers a binary counter to advance the accumulated count therein by one. The accumulated count of the counter is a binary representation of the total energy content of the input pulse signal. In the illustrated embodiment, gating means are provided for gating the output of the mixer into the counter when an input pulse is present, and for gating the output of the mixer into a low frequency feedback loop when an input pulse is not present to generate the error signal mentioned above.

Further objects of the invention will be better understood from the following description accompanied by the attached drawing which is a block schematic of apparatus according to the present invention.

Referring then to the drawing, an input pulse signal, indicated at reference numeral 10, is fed to the input of a voltage-responsive oscillator 12. A mixer circuit 14 receives the output of the voltage-responsive oscillator 12. The mixer 14 also receives the output of a local oscillator 16 which establishes the reference frequency for the system.

The output of mixer 14 feeds two parallel paths. A first path consists of a gate 18, a discriminator 19 and a reactance amplifier 20 connected in series. Discriminator 19 also receives the reference signal of local oscillator 16. The reactance amplifier 20 controls the frequency of the local oscillator 16 in a manner described in detail below.

The second parallel path receiving the output signal from mixer 14 consists of a gate 22, a pulse shaping circuit 24, and a counter 26 in series. The parallel output of counter 26 feeds the input of a parallel gate 28. The outputs of the parallel gate 28 constitute the output binary signal, as indicated by reference numeral 30.

The input of a Schmitt trigger circuit 32 also receives the input pulse signal 10. One output from the Schmitt trigger circuit 32, indicated by numeral **32*a*, is connected to the enable input of the gate 22**.

A second output line **32*b* from Schmitt trigger circuit 32 carries the binary complement of the signal on output 32*a* and is connected to the enable input of gate 18 and to the enable input of the parallel gate 28. As will later be explained, output lines 32*a* and 32*b* are taken off of different points in the Schmitt trigger circuit such that line 32*a* carries an enabling signal during the receipt of an input pulse 10 and line 32*b* carries an enabling signal during the absence of an input signal 10**.

Still referring to the drawing, operation of the apparatus therein will now be described. The voltage-responsive oscillator 12 operates at a base frequency which should be higher than the highest frequency component expected to be present in the input pulse signal 10 so that it may follow fast changes. Oscillator 12 is chosen such that it is very stable in operating at its base frequency in the absence of an input signal. As mentioned above, the frequency of oscillation of voltage-responsive oscillator 12 increases linearly as a function of the instantaneous amplitude of input pulse signal 10.

There are many equivalent circuits having the characteristics of the voltage-responsive oscillator 12 as well as the other constituent circuits of the present system, all of which are well known to those skilled in the art and which may be used to practice the present invention. In our preferred embodiment, voltage-responsive oscillator 12 is a backward wave oscillator. It is noted that applicants do not intend the invention to be limited to the component circuits as are described in the present example, but intend to cover all modifications and equivalents substituted therefor in accordance with the spirit and scope of the appended claims.

The output signal of voltage-responsive oscillator 12 feeds an input of a conventional mixer circuit 14. The output of mixer circuit 14 is a continuous wave having an instantaneous frequency of oscillation proportional to the difference between the two input frequencies. The phase of mixer circuit 14, as described below, is compared with the reference signal of local oscillator 16 to indicate which input signal has the higher frequency.

The feedback loop, which maintains the local oscillator 16 at the same frequency as the base frequency of oscillator 12, employs conventional circuits known in automatic frequency control techniques except that the signal used for frequency control purposes, in the illustrated embodiment, is gated into the feedback loop only when there is no input pulse signal 10 present. In other words, in the absence of an input pulse signal 10, the gate 18 is enabled by output 32*b* of Schmitt trigger circuit 32, thereby allowing any signal from the output of mixer 14 to be coupled to the input of the discriminator 19. The D-C signal developed by discriminator 19 has an amplitude proportional to the frequency of the output voltage of mixer 14 and a polarity indicative of which of the two inputs to mixer 14 has the higher frequency. This is accomplished by comparing the output of mixer 14 as against the reference signal of local oscillator 16. This D-C voltage is used to control reactance amplifier 20 which is shunted across the tuned circuit of local oscillator 16. In the operation of this feedback loop, when there is an output voltage from mixer 14 being fed through gate 18, the D-C voltage generated by discriminator 19 shifts the operating frequency of local oscillator 16 up or down by drawing more or less reactive current from its tuned circuit thereby shifting its frequency in a direction such as to reduce the difference between it and the base frequency of voltage-responsive oscillator 12 to zero. It is to be noted that, preferably, this feedback loop has a frequency response that is low relative to the base frequency of voltage-responsive oscillator 12.

The Schmitt trigger circuit 32 is also of conventional design and consists of a bistable circuit in which an output pulse of constant amplitude exists on output 32*a* if and only if input pulse signal 10 exceeds a certain minimum threshold voltage. The minimum threshold voltage for Schmitt trigger circuit 32 for the present invention is adjusted to be relatively close to whatever voltage is present at its input, in the absence of input pulse 10, since it is desirable to gate the output of mixer circuit 14 into counter 26 directly upon receipt of an input pulse signal 10. Output 32*b* is merely the reset side of the bistable circuit comprising the output stage of Schmitt trigger circuit 32, and there is a logic "one" present at output 32*b* whenever the input to Schmitt trigger circuit 32 falls below its minimum threshold voltage. The output 32*b* of Schmitt trigger circuit 32 is, therefore, used to enable gate 18 to energize the feedback control loop of local oscillator 16 in the absence of an input pulse signal 10 and to signal the absence of an input pulse thereby indicating that counter 26 contains a binary representation of the previous pulse.

When output 32*a* has a "one," indicating the presence of an input pulse signal 10, the gate 22 is enabled, allowing the output of mixer circuit 14 to feed the input of pulse shaping circuit 24. Pulse shaping circuit 24 comprises a monostable multivibrator circuit responsive only to the positive-going edge of the continuous wave from mixer 14. The output of pulse shaping circuit 24 is a single pulse extending in time for less than one half of a cycle of the highest frequency expected from mixer 14. This pulse occurs once for every frequency cycle of the output signal of mixer circuit 14 transmitted through gate 22. The output pulses from pulse shaping circuit 24 are then counted in counter 26 which comprises a plurality of bistable circuits connected in conventional counting fashion.

It will be noted that the illustrated embodiment may be somewhat simplified with a decrease in accuracy. If gate 22 and gate 18 are eliminated so that the output of mixer 14 feeds pulse shaping circuit 24 and discriminator 19 in parallel and with the same signal, then the counter 26 will have its count increased between input pulses by the signal representing the frequency difference between the base frequency of voltage-responsive oscillator 12 and the frequency of local oscillator 16. If both circuits have a good long term stability, this should not introduce very great error. At the same time, the feedback loop must be designed to have only a low frequency response so that the increase in frequency at the output of mixer 14 due to the presence of input pulse 10 does not appreciably alter the reference frequency of local oscillator 16.

The quantizing process may be thought of as counting the incremental elements of area under the envelope of the input pulse signal 10. Each incremental element may be described as the product of a voltage (the instantaneous amplitude of input pulse signal 10) and an increment of time, and these elements may be though of as quantums of energy. A main feature of the present invention breaks these elements down into equal products and then integrates the total number of quantums in a binary counter. That is, as the instantaneous amplitude of the input pulse signal 10 increases, it produces a linear increase in the number of pulses per unit time summed by counter 26. The count accumulated at the end of each pulse therefore represents the time integral or energy of the pulse.

When the input pulse signal 10 terminates, as indicated by the switching of the outputs of Schmitt trigger circuit 32 responsive to input pulse signal 10 falling below its minimum threshold voltage, line 32*b* has a positive voltage which enables the parallel gate 28 to receive the outputs of the bistable of counter 26. This voltage on line 32*b* signals the end of the quantizing of an input signal 10 and transmits the quantized representation contained in counter 26 through parallel gate 28 as the output binary signal voltage, indicated by reference numeral 30.

The output quantized representation of the input pulse signal 10 may then be stored in any binary memory, such as a magnetic core memory, for subsequent analysis similar to present methods of analyzing pulse heights. It will be noted that immediately after a quantized representation of the input pulse signal 10 has been gated through parallel gate 28, counter 26 must be reset and the apparatus will be ready to receive another input pulse signal 10. It will also be noted that there is very little apparatus dead time between input pulses.

The embodiments of the invention in which an exclusive property or privilege is claimed are defined as follows:

1. A device for quantizing the energy content of an input pulse, comprising:

first oscillator means oscillating at a base frequency and receiving said input pulse for generating an output signal having a linear frequency shift from said base frequency responsive to the instantaneous amplitude of said input pulse;

second oscillator means producing an output signal having a frequency equal to the base frequency of said first oscillator means;

mixer means receiving the output signals of said first and second oscillator means for producing an output signal having a frequency representative of the difference of instantaneous operating frequencies of said first and second oscillator means;

threshold detecting means receiving said input pulse for producing first and second control signals respectively representative of the presence and absence of said input pulse;

gating means connected to said mixer means for only passing said mixer output signal in response to said first control signal; and counter means connected to the output of said gating means and adapted to advance its count for each frequency cycle detected at its input, thereby accumulating a count representative of the total number of frequency cycles in said mixer output signal during the presence of said input pulse.

2. The device of claim 1 further comprising:

second gating means connected to said mixer means for only passing said mixer output signal in response to said second control signal;

means receiving the output of said second gating means for generating an error signal responsive to the frequency of said mixer output signal;

means receiving said error signal and associated with said second oscillator means for changing the frequency of said second oscillator output signal responsive to said error signal in a direction tending to decrease said error signal, whereby any output signal of said mixer means during the absence of an input pulse is used to generate an error signal to adjust the operating frequency of said second oscillator means to reduce said mixer output signal.

References Cited

UNITED STATES PATENTS

| | | |
|---|---|---|
| 3,094,875 | 6/1963 | Fluegel. |
| 3,346,694 | 10/1967 | Brady. |

RUDOLPH V. ROLINEC, Primary Examiner

P. F. WILLE, Assistant Examiner

U.S. Cl. X.R.

324—99